United States Patent [19]
Wills et al.

[11] Patent Number: 5,406,116
[45] Date of Patent: Apr. 11, 1995

[54] DOPANT IMPLANT FOR CONDUCTIVE CHARGE LEAKAGE LAYER FOR USE WITH VOLTAGE CONTRAST

[75] Inventors: Kendall S. Wills; John S. Bartlett, both of Houston; Thomas J. Aton, Dallas; David E. Littlefield, Garland, all of Tex.

[73] Assignee: Texas Instruments Incorporated, Dallas, Tex.

[21] Appl. No.: 162,813

[22] Filed: Dec. 6, 1993

Related U.S. Application Data

[63] Continuation of Ser. No. 46,509, Apr. 12, 1993, abandoned, which is a continuation of Ser. No. 667,783, Mar. 11, 1991, abandoned.

[51] Int. Cl.$^6$ ................. H01L 29/34; H01L 21/22
[52] U.S. Cl. ................. 257/630; 257/632; 257/645; 257/651; 257/660; 257/788; 437/141; 437/235; 437/236; 437/240
[58] Field of Search ............ 357/51, 52; 437/141, 437/235, 236, 240; 257/630, 632, 645, 651, 660, 788

[56] References Cited

U.S. PATENT DOCUMENTS

| | | | |
|---|---|---|---|
| 3,518,494 | 6/1970 | James | 257/660 |
| 4,124,863 | 11/1978 | Mason | 257/620 |
| 5,005,064 | 4/1991 | Yoshino et al. | 357/52 |

*Primary Examiner*—Edward Wojciechowicz
*Attorney, Agent, or Firm*—Ronald O. Neerings; James C. Kesteson; Richard L. Donaldson

[57] ABSTRACT

A layer of dopant is implanted in the passivation of a semiconductor die to facilitate testing of the die by a scanning electron microscope voltage contrast system. The layer of dopant is capacitively coupled to circuits under the passivation and is coupled to ground to allow charge to bleed to ground through a high resistivity path. The resistivity is low enough to allow E-beam charge bleed off, but not bleed off of higher frequency capacitive coupled signals. The disclosure is also applicable to photo generated electron voltage contrast.

19 Claims, 1 Drawing Sheet

DOPANT IMPLANT FOR CONDUCTIVE CHARGE LEAKAGE LAYER FOR USE WITH VOLTAGE CONTRAST

This application is a Continuation of application Ser. No. 08/046,509, now abandoned, filed Apr. 12, 1993, which is a continuation of application Ser. No. 07/667,783, filed Mar. 11, 1991 (now abandoned).

FIELD OF THE INVENTION

This invention relates to forming a continuous conductive layer on the top surface of the passivation of a semiconductor die. In particular, this invention relates to implanting a dopant into the passivation of a semiconductor die to provide a small leakage path to ground, and more particularly to implanting a dopant in the passivation of a semiconductor die to create a conductive charge leakage layer to facilitate the use of a voltage contrast system to detect electrons generated by a scanning electron microscope or generated by photo excitation.

BACKGROUND OF THE INVENTION

Semiconductor manufacturers need a practical and effective method of inspecting their dies. One system presently available to the manufacturers is a scanning electron microscope (SEM) voltage contrast (VC) system. Use of the SEM VC system to test a die, however, creates a surface charge problem on the die which interferes with testing.

Another voltage contrast system generates electrons from a metal surface by photo excitation. In such systems, testing must be performed in a vacuum. When a dielectric covers the metal, "low level," UV excitation is used to partially ionize the dielectric. This allows conduction of the photo generated electrons to the surface of the dielectric where they can be detected.

Currently, at least part of the die passivation must be removed for successful SEM VC system testing. Removal of all die passivation, however, poses the risk that the die will not function. A focused ion beam mill or a laser by ablation or chemical means can act to remove passivation from localized spots on the die. An application of photo resist can be used as an etch mask for spot removal of passivation. The resist is patterned where desired by scratching the resist or exposing the resist to light/SEM and subsequently developing the resist. An etch of the passivation then removes the material from the spot to be analyzed by the SEM VC system. Unfortunately, all of these techniques are slow and limited in the number of locations which can be easily processed.

What is needed is a method that prevents surface charge problems associated with SEM VC system testing of a die without the removal of die passivation. Also needed is a method of collecting the charge from passivated devices which are subject to photo excitation without the need for a vacuum chamber.

SUMMARY OF THE INVENTION

In accordance with one embodiment of the invention, a continuous conductive layer is formed on the top surface of the passivation of a semiconductor die. The continuous conductive layer prevents local surface charging problems associated with voltage contrast system testing of a die. The continuous conductive layer facilitates voltage contrast testing of a die without removal of die passivation.

In another embodiment of the invention, an implanter or a focused ion beam mill/implanter implants a dopant into the passivation of a semiconductor die. The doped layer of the passivation provides a small leakage path to ground. The resistance of the doped layer is, however, high enough to allow capacitive coupling to the underlying layers. The doped layer prevents surface charge problems associated with SEM VC system testing of a die without the removal of die passivation.

For photo excited voltage contrast the resistance of the doped layer can be high enough to allow capacitive coupling or be low enough to allow the photo generated electrons to be collected and measured as a current to ground. In the latter case a vacuum chamber is not required for testing the device.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE INVENTION

Figure 1:
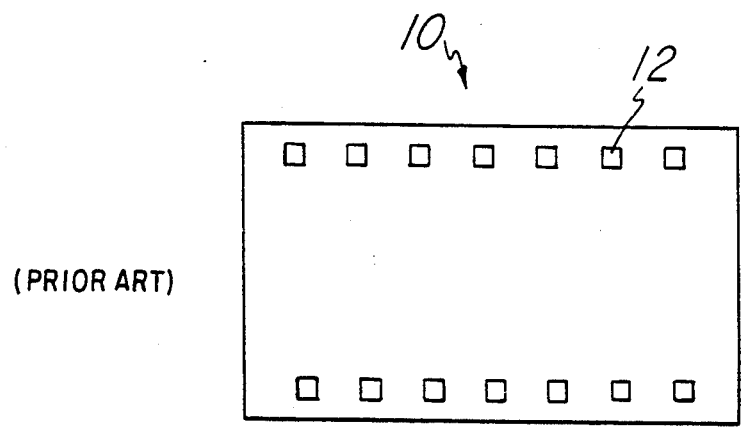
FIG. 1 is a top view of a die.

FIG. 1 discloses a semiconductor die 10 having bond pads 12. The size and shape of die 10 and the number and position of bond pads 12 are merely descriptive for the purposes of this application. In practice, semiconductor dies will exist in various sizes, shapes and depths. The number and position of bond pads may also vary.

Figure 2:
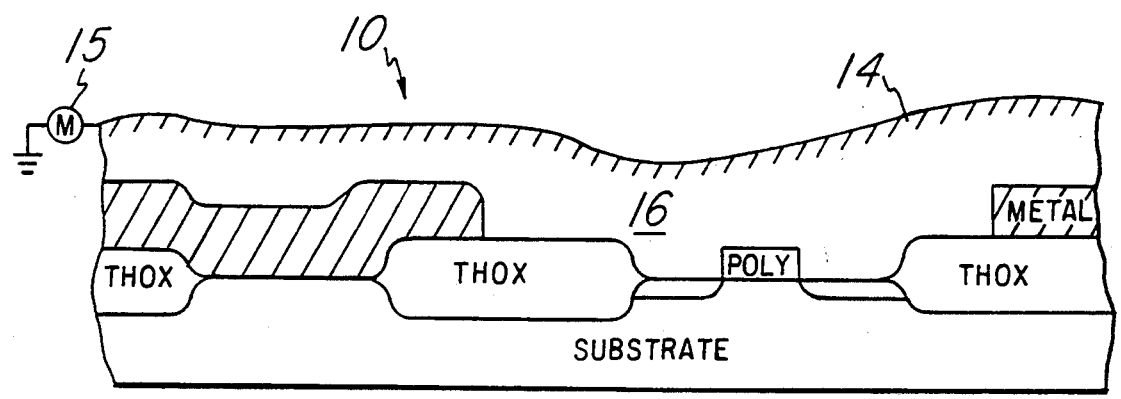
FIG. 2 is a side view in section, greatly enhanced, of the device of FIG. 1, taken along the lines 1-1, according to the invention.

For SEM voltage contrast testing, a continuous conductive layer 14 is formed on the top surface of passivation 16 of die 10, as shown in FIG. 2. Continuous conductive layer 14 prevents local charging of the passivation during voltage contrast testing. In one embodiment of the invention, continuous conductive layer 14 is a layer of dopant implanted in the passivation 16 of die 10. Examples of dopants include gallium, phosphorus, boron, and arsenic. The resistivity of the layer of dopant should be low enough to allow E-beam charge bleed off but not allow bleed off of higher frequency capacitive coupled signals. A minimum resistance of 2,000 ohms per square is recommended for continuous conductive layer 14 when capacitive coupling is desired. Resistances greater than 25,000,000 ohms per square tend to be counterproductive.

Continuous conductive layer 14 may also be formed by laser doping, laser deposition, ion implanting, sputtering, evaporation or other methods known to those skilled in the art.

Figure 3:
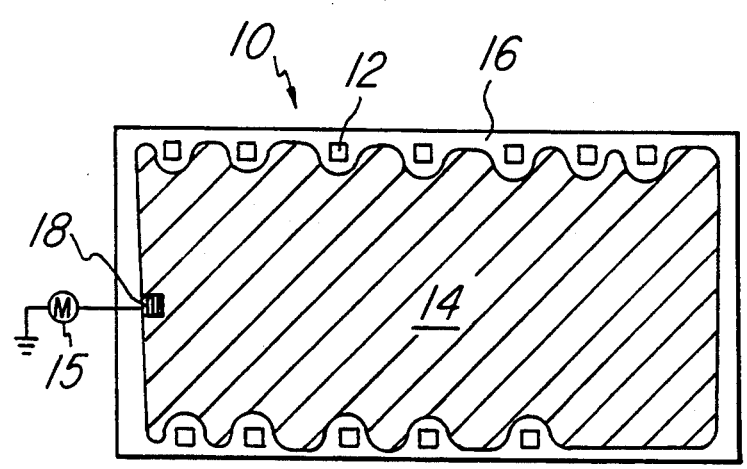
FIG. 3 is a top view of a die according to the invention.

FIG. 3 discloses a semiconductor die 10 having bond pads 12 and a continuous conductive layer 14 according to the invention. Continuous conductive layer 14 approaches but does not touch bond pads 12. Preferably, continuous conductive layer 14 provides a small leakage path to ground. Grounding may be accomplished through an internal ground path of the die or an external ground bond pad 18. Grounding prevents both local charging of the passivation 16 and uniform charging of the continuous conductive layer 14 during voltage contrast testing. Continuous conductive layer 14 will dissipate local charging of the passivation even if not grounded. As a result, the charge build up which normally kills the usefulness of the SEM VC system does not occur.

For photo generated voltage contrast testing only, a continuous conductive layer 14 is formed in the passivation 16 of die 10, as shown in FIG. 2. In one embodiment of the invention, continuous conductive layer 14 is a layer of dopant implanted in the passivation 16 of die 10. Examples of dopants include gallium, phosphorus, boron, and Arsenic. The resistivity of the layer of dopant should be low enough to allow photo generated electrons to be collected and the charge bled off through a meter 15 to ground. The minimum resistance of the continuous conductive layer 14 can approach zero ohms per square. Resistances greater than 2,000 ohms per square tend to be counterproductive. In this case, a vacuum chamber is no longer required.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor device comprising:
   a die, said die having a passivation that is the uppermost layer on said die; and
   a portion of said passivation being conductive adjacent a top surface of said passivation, said conductive portion providing a leakage path to dissipate charge.

2. A device according to claim 1, wherein the conductive portion is a continuous conductive layer.

3. A device according to claim 2 wherein said continuous conductive layer is a continuous conductive film.

4. A device according to claim 1, wherein the conductive portion is a layer of dopant implanted into the top surface of the passivation.

5. A device according to claim 4 wherein said dopant is gallium.

6. A device according to claim 4 wherein said dopant is phosphorus.

7. A device according to claim 4 wherein said dopant is boron.

8. A device according to claim 4 wherein said dopant is Arsenic.

9. A device according to claim 2 wherein said continuous conductive layer has a resistance up to 2,000 ohms per square.

10. A device according to claim 2 wherein said continuous conductive layer has a resistance in the range of 2,000 to 25,000,000 ohms per square.

11. A device according to claim 2 wherein said continuous conductive layer is coupled to a ground path within the die.

12. A device according to claim 2 wherein said continuous conductive layer is coupled to an external ground.

13. A device according to claim 2 wherein said continuous conductive layer is not grounded.

14. A method of preparing a semiconductor die for voltage contrast testing, comprising the steps of:
   forming a die having a passivation that is the uppermost layer on said die; and
   forming a portion of said passivation being conductive adjacent a top surface of said passivation, said conductive portion providing a leakage path to dissipate charge.

15. The method of claim 14 wherein said conductive portion is a layer of dopant implanted into the passivation of said semiconductor die.

16. The method of claim 14 including coupling the conductive portion to ground.

17. The method of claim 14, wherein the conductive portion is formed by laser deposition.

18. The method of claim 14, wherein the conductive portion is formed by evaporation 19. A semiconductor device comprising:
   a die, said die having a passivation that is the uppermost layer on said die; and
   a single continuous conductive portion formed in said passivation, said continuous conductive portion forming a leakage path to dissipate charge.

* * * * *